United States Patent
Rhee et al.

(10) Patent No.: US 12,027,965 B2
(45) Date of Patent: Jul. 2, 2024

(54) SWITCH CONTROL APPARATUS AND METHOD

(71) Applicant: HYUNDAI AUTOEVER CORP., Seoul (KR)

(72) Inventors: Woo Won Rhee, Seoul (KR); Dong Hwi Lim, Seoul (KR)

(73) Assignee: HYUNDAI AUTOEVER CORP., Seoul (KR)

(*) Notice: Subject to any disclaimer, the term of this patent is extended or adjusted under 35 U.S.C. 154(b) by 20 days.

(21) Appl. No.: 18/089,160

(22) Filed: Dec. 27, 2022

(65) Prior Publication Data

US 2023/0208276 A1   Jun. 29, 2023

(30) Foreign Application Priority Data

Dec. 28, 2021   (KR) .................. 10-2021-0189361

(51) Int. Cl.
*H02M 1/08*   (2006.01)
*H02J 7/00*   (2006.01)
*H02M 1/42*   (2007.01)
*H03K 3/017*   (2006.01)

(52) U.S. Cl.
CPC .............. *H02M 1/08* (2013.01); *H02J 7/007* (2013.01); *H02M 1/42* (2013.01); *H03K 3/017* (2013.01)

(58) Field of Classification Search
CPC ...................................................... H02M 1/08
USPC ........................................................ 327/109
See application file for complete search history.

(56) References Cited

U.S. PATENT DOCUMENTS

| | | | |
|---|---|---|---|
| 8,786,133 B2 | 7/2014 | Cheng et al. | |
| 9,257,916 B2 | 2/2016 | Cheng et al. | |
| 2011/0012430 A1 | 1/2011 | Cheng et al. | |
| 2011/0066903 A1* | 3/2011 | Foster, Sr. ............. | G06F 1/206 |
| | | | 714/E11.169 |
| 2014/0285024 A1 | 9/2014 | Cheng et al. | |

FOREIGN PATENT DOCUMENTS

| | | |
|---|---|---|
| KR | 20120086283 A | 8/2012 |
| KR | 101625864 B1 | 6/2016 |
| KR | 20180069206 A | 6/2018 |
| KR | 101977412 B1 | 5/2019 |
| KR | 20200083871 A | 7/2020 |
| KR | 20210086825 A | 7/2021 |

OTHER PUBLICATIONS

Office Action cited in Korean patent application No. 10-2021-0189361; dated Nov. 14, 2023; 8 pp.

* cited by examiner

*Primary Examiner* — Tomi Skibinski
(74) *Attorney, Agent, or Firm* — Lempia Summerfield Katz LLC

(57) ABSTRACT

Methods and apparatuses for controlling a switch are provided. The method comprises: generating second control data, which is for controlling the switches, in a second cycle; determining whether a first control signal based on first control data, which has been generated in a first cycle, is being output to the charging system; and storing the second control data in a first register if it is determined that the first control signal is being output to the charging system.

20 Claims, 8 Drawing Sheets

| CONTROL METHOD | OBC | | LDC |
|---|---|---|---|
| | PFC | DCDC | |
| | DIGITAL CONTROL | DIGITAL CONTROL | ANALOG CONTROL |
| CONTROL OPERATION Core | Core0 | Core1 | - |
| Update ISR Core | Core2 | Core3 | - |
| Update ISR OPERATION TIME | 4us | 4us | - |
| Max SWITCHING FREQUENCY | ~250kHz | ~250kHz | - |

FIG. 4

| CONTROL METHOD | PFC | OBC | | LDC |
|---|---|---|---|---|
| | | DCDC | | |
| | DIGITAL CONTROL | DIGITAL CONTROL | DIGITAL CONTROL | DIGITAL CONTROL |
| CONTROL OPERATION Core | Core0 or Core1 | Core0 or Core1 | Core0 or Core1 | Core0 or Core1 |
| Update ISR — Core | Core3 | Core2 | | Core3 |
| Update ISR — OPERATION TIME | 2us | 2us | | 2us |
| Max SWITCHING FREQUENCY | ~250kHz | ~500kHz | | ~250kHz |

FIG. 8

SWITCH CONTROL APPARATUS AND METHOD

CROSS-REFERENCE TO RELATED APPLICATION

This application claims the benefit of and priority to Korean Patent Application No. 10-2021-0189361, filed on Dec. 28, 2021, the entire contents of which are incorporated herein by reference.

FIELD OF THE TECHNOLOGY

Embodiments of the present disclosure relate to a switch control method and apparatus, and more particularly, to a switch control method and apparatus capable of controlling switches included in a charger system at high speed.

BACKGROUND

As the general public is becoming more aware of rising environmental and energy problems, interests in eco-friendly vehicles such as hybrid vehicles and electric vehicles have been increasing as potential solution to said problems. Typically, an electric vehicle (EV) or a plug-in hybrid electric vehicle (PHEV) includes a high-voltage battery and a charging system with, for example, an on-board charger (OBC), for charging the high-voltage battery.

The charging system includes a plurality of switches, inductors, capacitors, and the like and controls the switches to charge or discharge the battery.

The control of the switches is performed based on pulse width modulation (PWM), and as PWM frequency increases, the capacitance of the inductors and capacitors can be lowered, and the miniaturization of the charging system can lower the manufacturing cost of the charging system. That is, if the PWM frequency increases so that the switches can be controlled at high speed, the charging system can be miniaturized and can be fabricated at lower cost.

Accordingly, an apparatus capable of controlling the switches in the charging system is needed.

SUMMARY

Aspects of the present disclosure provide a switch control apparatus and method capable of controlling switches in a charging system at high speed.

Aspects of the present disclosure also provide a switch control apparatus and method capable of supporting high pulse width modulation (PWM) frequency.

Aspects of the present disclosure also provide a switch control apparatus and method capable of digitally controlling switches included in a low-voltage direct current-to-direct current (DC-to-DC) converter.

Aspects of the present disclosure also provide a switch control apparatus and method capable of miniaturizing a charging system and lowering the manufacturing cost of the charging system.

However, aspects of the present disclosure are not restricted to those set forth herein. The above and other aspects of the present disclosure should become more apparent to one of ordinary skill in the art to which the present disclosure pertains by referencing the detailed description of the present disclosure given below.

According to an aspect of the inventive concept, there is a provided method for controlling a switch in which a control device controls switches included in a charging system. The method comprises: generating second control data, which is for controlling the switches, in a second cycle, determining whether a first control signal based on first control data, which has been generated in a first cycle is being output to the charging system and storing the second control data in a first register if it is determined that the first control signal is being output to the charging system.

In some embodiments, the first cycle may be a cycle previous to the second cycle.

In some embodiments, determining whether the first control signal is being output to the charging system may comprise: determining that the first control signal is being output to the charging system, if the first control data is stored in a second register, the second register obtains the first control data from the first register and stores the obtained first control data therein in the first cycle or in a cycle previous to the first cycle, and the first control signal is output based on the first control data stored in the second register.

In some embodiments, determining whether the first control signal is being output to the charging system may comprise identifying a synchronization reference value. In particular, when the synchronization reference value is set to a first value, and the first value is a value indicating that the first control signal is being output to the charging system, it is determined that the first control signal is being output to the charging system.

In some embodiments, the switch control method may further comprise setting the synchronization reference value to a first value or a second value after the storing the second control data in the first register. The first value indicates that a second control signal based on the second control data is being output to the charging system, and the second value indicates that the second control signal is not being output to the charging system.

In some embodiments, storing the second control data in the first register may comprise: inactivating an update function for the second register, storing the second control data in the first register, and storing the second control data stored in the first register in the second register by activating the update function for the second register.

In some embodiments, setting the synchronization reference value to the first or second value may comprise setting the synchronization reference value to the first or second value based on whether the data stored in the first register coincides with data stored in the second register or not.

In some embodiments, the switch control method may further comprise deferring the storing of the second control data in the first register until the first control signal is output, if it is determined that the first control signal is not being output to the charging system.

In some embodiments, generating the second control data in the second cycle may be performed by a first core included in a processor, and storing the second control data in the first register may be performed by a second core included in the processor.

In some embodiments, the first control signal may be a pulse width modulation (PWM)-based signal.

In some embodiments, the first control signal may be a signal for controlling switches included in a power factor correction converter, switches included in a high-voltage direct current-to-direct current (DC-to-DC) converter, and/or switches included in a low-voltage DC-to-DC converter.

According to another aspect of the inventive concept, there is a provided apparatus for switch control. The apparatus comprises: a first register, a second register that stores first control data generated in a first cycle, a first core generating second control data, which is for controlling switches included in a charging system, in a second cycle, and a second core that stores the second control data in the first register if it is determined that a first control signal based on the first control data is being output to the charging system.

In some embodiments, the first cycle may be a cycle previous to the second cycle.

In some embodiments, the first control signal may be a signal for controlling switches included in a power factor correction converter, switches included in a high-voltage direct current-to-direct current (DC-to-DC) converter, and/or switches included in a low-voltage DC-to-DC converter.

In some embodiments, the switch control apparatus may further comprise an analog-to-digital converter (ADC) configured to sense a current or voltage generated in the charging system and convert the sensed current or voltage into digital data. In particular, the first core generates second control data, which is used for controlling the switches, in the second cycle if a sensing operation performed by the ADC is stopped.

In some embodiments, the second register may store pulse width modulation (PWM) duty data or frequency data.

In some embodiments, the second register may obtain data stored in the first register and may store the obtained data therein upon the arrival of a predetermined cycle.

In some embodiments, the second core may determine that the first control signal is being output to the charging system, if the synchronization reference value is set to a first value, and may determine that the first control signal is not being output to the charging system if the synchronization reference value is set to a second value.

In some embodiments, the second core may set the synchronization reference value to a first value if a second control signal based on the second control data is being output to the charging system after storing the second control data in the first register, and may set the synchronization reference value to a second value if the second control signal is not being output to the charging system.

In some embodiments, the second core may set the synchronization reference value to the first or second value based on whether data stored in the first register coincides with data stored in the second register after storing the second control data in the first register.

BRIEF DESCRIPTION OF THE DRAWINGS

The above and other aspects and features of the present disclosure will become more apparent by describing in detail exemplary embodiments thereof with reference to the attached drawings, in which:

FIG. 4 is a table showing the time taken by each core to perform a control operation in the case of using a spinlock according to an embodiment of the present disclosure;

FIG. 8 is a table showing the time taken by each core to perform a control operation in a case where the switch control method according to an embodiment of the present disclosure is applied.

DETAILED DESCRIPTION

Figure 1:
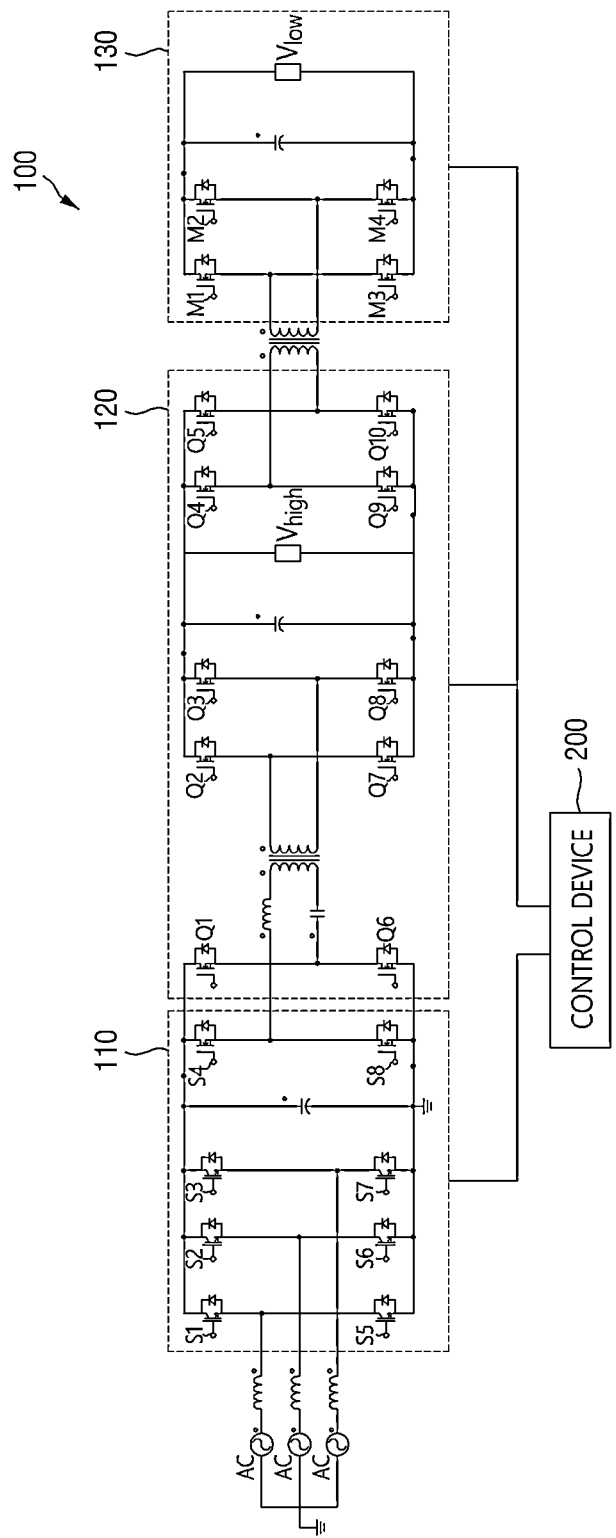
FIG. 1 is a circuit diagram illustrating a control device and a charging system according to an embodiment of the present disclosure.

Hereinafter, embodiments of the present disclosure are described with reference to the attached drawings. Advantages and features of the present disclosure and methods of accomplishing the same may be understood more readily by reference to the following detailed description of the embodiments and the accompanying drawings. The present disclosure may, however, be embodied in many different forms and should not be construed as being limited to the embodiments set forth herein.

In adding reference numerals to the components of each drawing, it should be noted that the same reference numerals are assigned to the same components as much as possible even though they are shown in different drawings. In addition, in describing the present disclosure, when it is determined that the detailed description of the related well-known configuration or function may obscure the gist of the present disclosure, the detailed description thereof is omitted.

Unless otherwise defined, all terms used in the present specification (including technical and scientific terms) may be used in a sense that can be commonly understood by those having ordinary skill in the art. In addition, the terms defined in the commonly used dictionaries are not ideally or excessively interpreted unless they are specifically defined clearly. The terminology used herein is for the purpose of describing particular embodiments only and is not intended to be limiting of the disclosure. In this specification, the singular also includes the plural unless specifically stated otherwise in the phrase.

In addition, in describing the component of this disclosure, terms, such as first, second, A, B, (a), (b), can be used. These terms are only for distinguishing the components from other components, and the nature or order of the components is not limited by the terms. If a component is described as being "connected," "coupled" or "contacted" to another component, that component may be directly connected to or contacted with that other component, but it should be understood that another component also may be "connected," "coupled" or "contacted" between each component. When a component, device, element, or the like of the present disclosure is described as having a purpose or performing an operation, function, or the like, the component, device, or element should be considered herein as being "configured to" meet that purpose or to perform that operation or function.

Hereinafter, embodiments of the present disclosure are described with reference to the attached drawings.

FIG. 1 is a circuit diagram illustrating a control device and a charging system according to an embodiment of the present disclosure.

Referring to FIG. 1, a charging system 100 may include one or more alternating current (AC) power sources, a plurality of inductors, a power factor correction converter 110, a high-voltage direct current-to-direct current (DC-to-DC) converter 120, and a low voltage DC-to-DC converter 130.

The power factor correction converter 110 may reduce the reactive power of AC power input from the outside and convert it into a DC voltage. To this end, the power factor correction converter 110 may include a plurality of switches S1 through S8 and a capacitor. Each of the switches S1 through S8 may be opened or closed by the control device 200.

The high-voltage DC-to-DC converter 120 may include a plurality of switches Q1 through Q10, a high-voltage battery Vhigh, and a capacitor. The high-voltage DC-to-DC converter 120 may charge the high-voltage battery Vhigh with AC power provided from the power factor correction converter 110 or may supply power from the high-voltage battery Vhigh to a load or the low-voltage DC-to-DC converter 130. The high-voltage battery Vhigh may be charged and discharged through the control of the switches Q1 through Q10 of the high-voltage DC-to-DC converter 120. The switches Q1 through Q10 may be opened or closed by the control device 200.

The low-voltage DC-to-DC converter 130 may include a plurality of switches M1 through M4, a low-voltage battery Vlow, and a capacitor. The low-voltage DC-to-DC converter 130 may charge the low-voltage battery Vlow with power provided by the high-voltage DC-to-DC converter 120 from the high-voltage battery Vhigh and may supply power from the low-voltage battery Vlow to the load or the high-voltage DC-to-DC converter 120. The low-voltage battery Vlow may be charged and discharged through the control of the switches M1 through M4 of the low-voltage DC-to-DC converter 130. The switches M1 through M4 may be opened or closed by the control device 200.

The control device 200 may control the switches S1 through S8 of the power factor correction converter 110, the switches Q1 through Q10 of the high-voltage DC-to-DC converter 120, and the switches M1 through M4 of the low-voltage DC-to-DC converter 130 by transmitting control signals to the power factor correction converter 110, the high-voltage DC-to-DC converter 120, and the low-voltage DC-to-DC converter 130. That is, the control device 200 may control the opening and the closing of the switches S1 through S8 of the power factor correction converter 110, the switches Q1 through Q10 of the high-voltage DC-to-DC converter 120, and the switches M1 through M4 of the low-voltage DC-to-DC converter 130 at high speed. The control device 200 may control the switches S1 through S8 of the power factor correction converter 110, the switches Q1 through Q10 of the high-voltage DC-to-DC converter 120, and the switches M1 through M4 of the low-voltage DC-to-DC converter 130 at high speed. To this end, the control device 200 may use a switch control algorithm that is described below.

Figure 2:
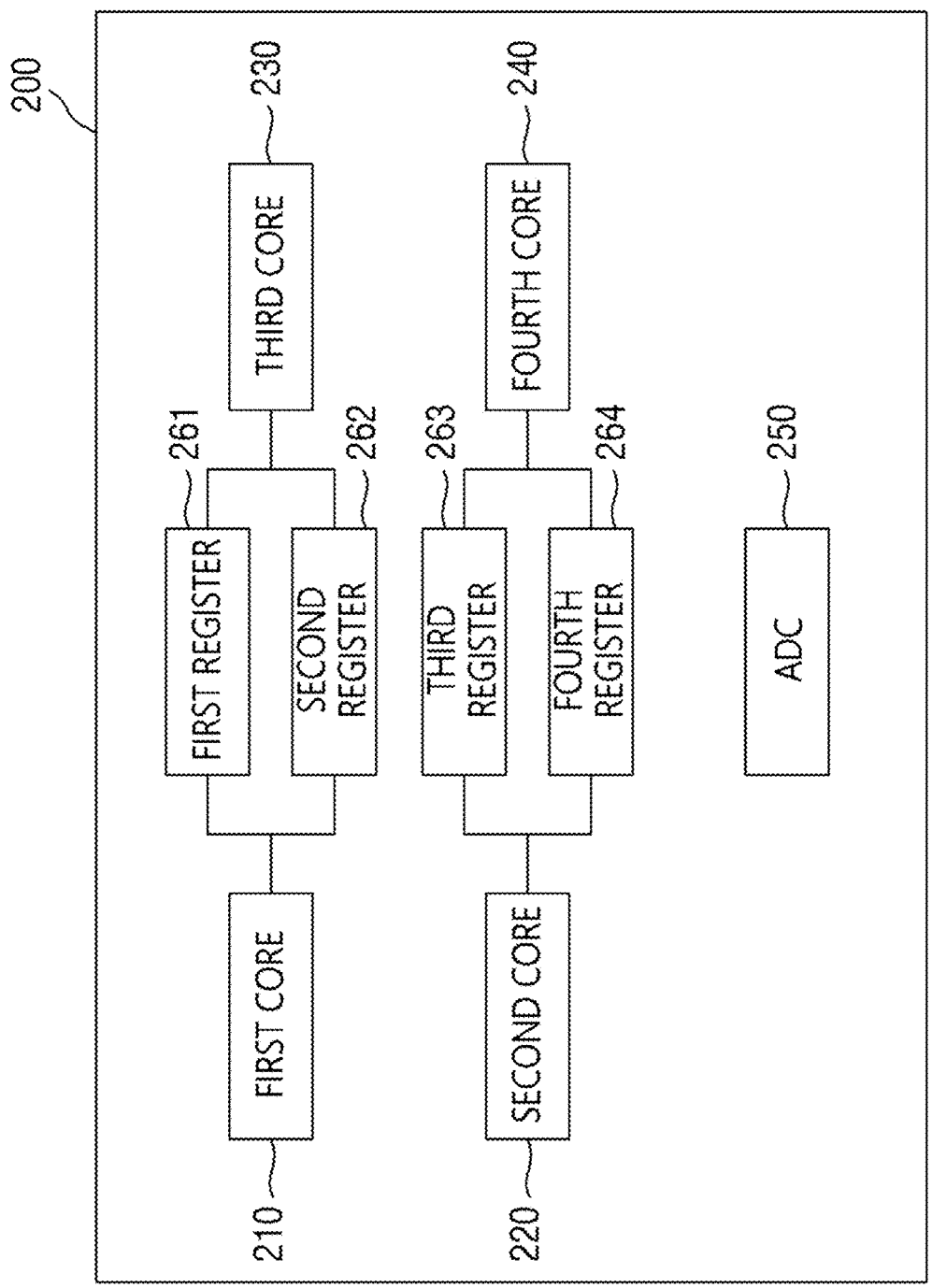
FIG. 2 is a block diagram illustrating the control device according to an embodiment of the present disclosure.

FIG. 2 is a block diagram illustrating the control device according to an embodiment of the present disclosure.

Referring to FIG. 2, the control device 200 may include: a plurality of first, second, third, and fourth cores 210, 220, 230, and 240, a plurality of first, second, third, and fourth registers 261, 262, 263, and 264, and an analog-to-digital converter (ADC) 250.

The first, second, third, and fourth cores 210, 220, 230, and 240 may perform different control operations. For example, the first and third cores 210 and 230 may perform a control operation for switch control, and the second and fourth cores 220 and 240 may perform a control operation for register update. In other words, a pair of cores may be set as a group, one of the pair of cores may perform a control operation for switch control, and the other core may perform a control operation for register update.

The first, second, third, and fourth registers 261, 262, 263, and 264, which are means for storing data, may store data computed by the first, second, third, and fourth cores 210, 220, 230, and 240. The first, second, third, and fourth registers 261, 262, 263, and 264 may be classified by different functions. For example, the first register 261 may temporarily store data in an n-th cycle, and the second register 262 may obtain the data from the first register 261 and store the obtained data in an (n+1)-th cycle. In another example, the third register 263 may temporarily store data in the n-th cycle, and the fourth register 264 may acquire the data from the third register 263 and store the obtained data in the (n+1)-th cycle. In other words, in a particular cycle, the first register 261 may perform the functions of a shadow register, and the second register 262 may be synchronized with the first register 261. Similarly, in a particular cycle, the third register 263 may perform the functions of a shadow register, and the fourth register 264 may be synchronized with the third register 263.

A switch control signal may be generated based on data stored in the second or fourth register 262 or 264. The data stored in the second or fourth register 262 or 264 may be at least one of PWM duty data and switching frequency data. Signals for controlling the switches S1 through S8 of the power factor correction converter 110, the switches Q1 through Q10 of the high-voltage DC-to-DC converter 120, and the switches M1 through M4 of the low-voltage DC-to-DC converter 130 may be output to the charging system 100 based on the data stored in the second or fourth register 262 or 264.

The signals for controlling the switches S1 through S8 of the power factor correction converter 110, the switches Q1 through Q10 of the high-voltage DC-to-DC converter 120, and the switches M1 through M4 of the low-voltage DC-to-DC converter 130 may be output to the charging system 100 by a separate core or processor or by the second or fourth core 220 or 240.

FIG. 2 illustrates an example in which the first and third cores 210 and 230 and the first and second registers 261 and 262 are grouped together and the second and fourth cores 220 and 240 and the third and fourth registers 263 and 264 are grouped together.

FIG. 2 illustrates that the first, second, third, and fourth registers 261, 262, 263, and 264 are separate elements of the control device 200. Alternatively, the first register 261 may be included in the first core 210, the second register 262 may be included in the third core 230, the third register 263 may be included in the second core 220, and the fourth register 264 may be included in the fourth core 240. In some embodiments, the first, second, third, and fourth cores 210, 220, 230, and 240 may be included in a single processor or may be distributed between multiple processors.

The ADC 250 may measure each current or voltage included in the charging system 100 and may convert the result of the measurement, i.e., analog data, into digital data. The ADC 250 may measure the current or voltage of the charging system 100 at intervals of a number of cycles. The ADC 250 may measure the current or voltage at one or more points in the charging system 100.

Hereinafter, the amount of time required to perform a control operation in the case of using a spinlock supported by a processor and cycles of the control operation is described with reference to FIGS. 3 and 4.

Figure 3:
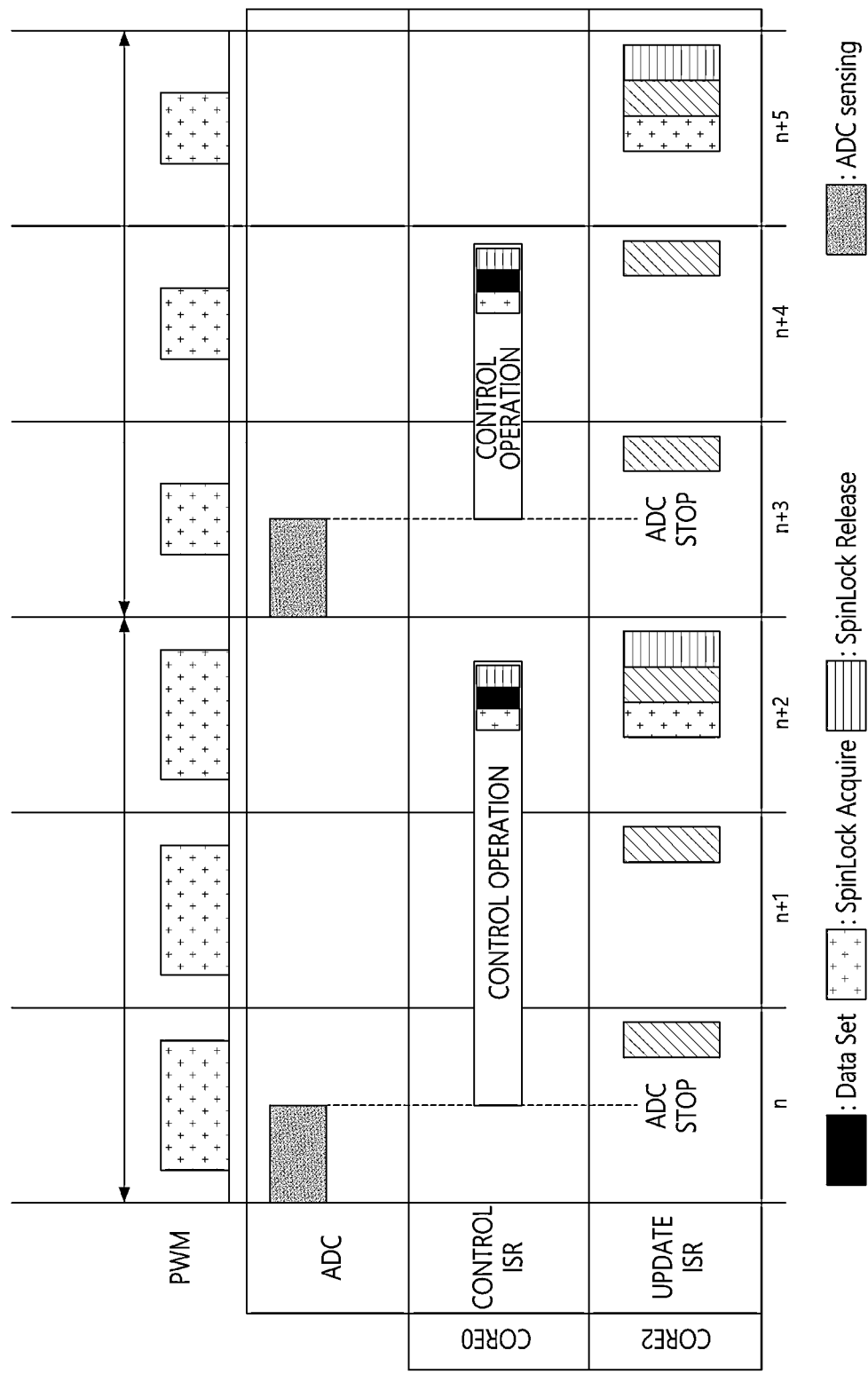
FIG. 3 illustrates cycles of a control operation in a case where a switch control signal is generated using a spinlock according to an embodiment of the present disclosure.

FIG. 3 illustrates cycles of a control operation when a switch control signal is generated using a spinlock. Referring to FIG. 3, "CORE0" refers to the first core 210, and "CORE2" refers to the third core 230.

Referring to FIG. 3, when the ADC 250 stops current or voltage sensing, the first core 210 may perform a control operation for switch control in an n-th cycle. The first core 210 may perform the control operation based on a sensing value from the ADC 250.

The third core 230 may generate update signals at intervals of a number of cycles and may count the number of update signals generated. The third core 230 may perform an operation for a spinlock based on the result of the counting. The update signals are illustrated in FIG. 3 as being rectangles filled with diagonal lines. Referring to FIG. 3, the first and third cores 210 and 230 may perform a control operation based on an interrupt service routine (ISR) and reflect the result of the control operation.

In an (n+2)-th cycle, the third core 230 generates "Spinlock Acquire" for setting a spinlock to reflect the result of the control operation performed by the first core 210 without any loss, and generates "Spinlock Release" for releasing the spinlock when data corresponding to the result of the control operation performed by the first core 210 is stored in a register. While a spinlock is set, the writing of data to the register can be prevented, and only intended data can be reflected in the register. However, in the case of using a spinlock, a minimum of four cycles are required to generate a switch signal based on the data stored in the register after a control operation performed in an (n+3)-th cycle and to output a switch control signal to the charging system 100 based on the result of the control operation. That is, the time taken to perform the control operation increases due to a spinlock.

FIG. 4 is a table showing the time taken by each core to perform a control operation in the case of using a spinlock. Referring to FIG. 4, "PFC" refers to the power factor correction converter 110, "DCDC" refers to the high-voltage DC-to-DC converter 120, and "LDC" refers to the low-voltage DC-to-DC converter 130.

In a case where a switch control is performed at intervals of four cycles, a pair of cores is needed to control the power factor correction converter 110, and another pair of cores is needed to control the high-voltage DC-to-DC converter 120. Accordingly, an additional pair of cores is needed to digitally control the low-voltage DC-to-DC converter 130. In order not to use the additional pair of cores, the low-voltage DC-to-DC converter 130 need to be controlled in an analog manner. In the case of controlling the charging system 100 using a spinlock method, components or additional cores for analog switching may be needed.

Figure 5:
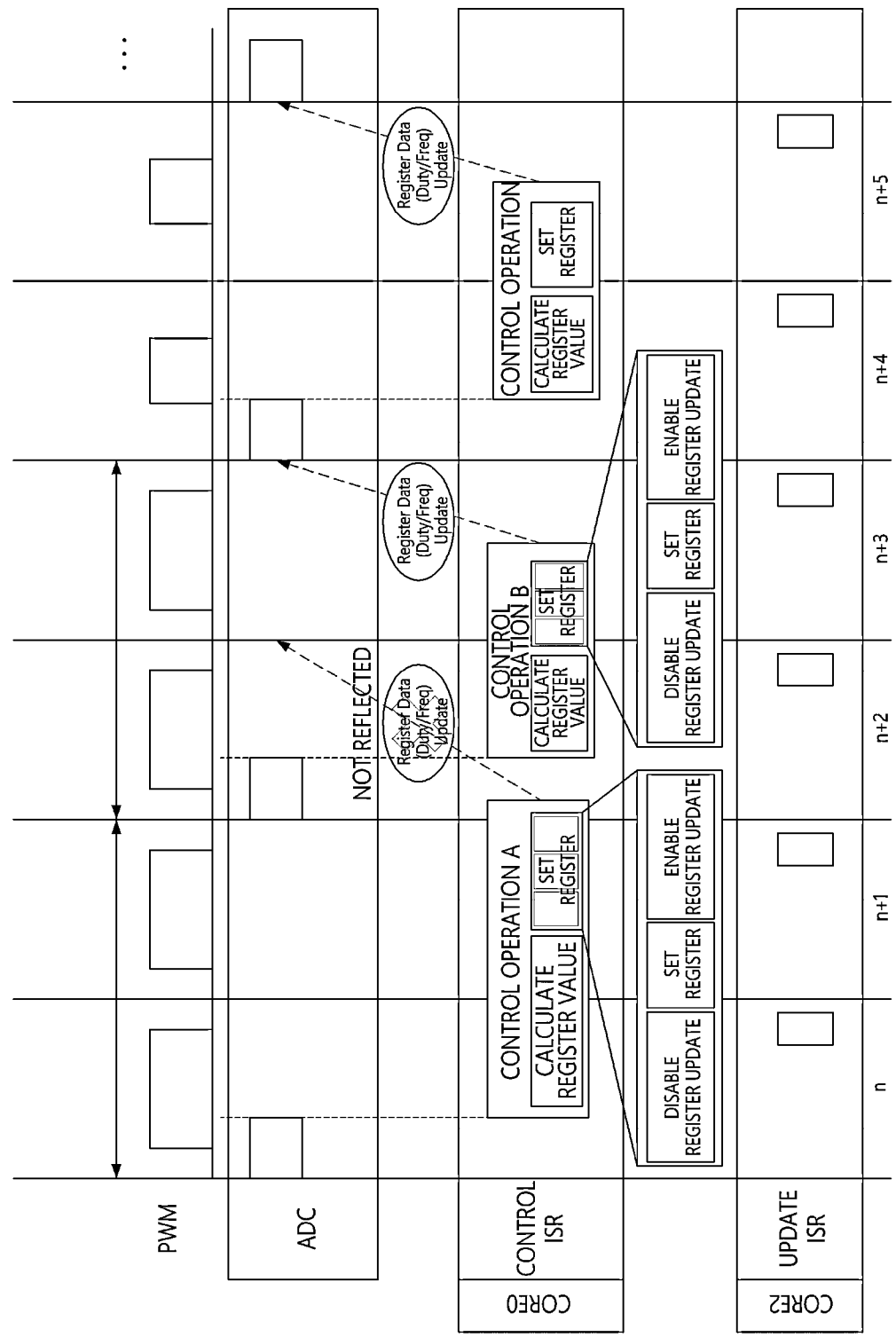
FIG. 5 illustrates how to generate a switch control signal by disabling and enabling a register update function according to an embodiment of the present disclosure.

FIG. 5 illustrates how to generate a switch control signal by disabling and enabling a register update function. Referring to FIG. 5, "CORE0" refers to the first core 210, and "CORE2" refers to the third core 230.

Referring to FIG. 5, when the ADC 250 stops current or voltage sensing, the first core 210 may perform a control operation for switch control in an n-th cycle. The first core 210 may perform the control operation based on a sensing value from the ADC 250.

The third core 230 may generate update signals at intervals of a number of cycles and may count the number of generated update signals. The update signals are illustrated in FIG. 5 as being rectangles. Referring to FIG. 5, the first and third cores 210 and 230 may perform a control operation based on an ISR and reflect the result of the control operation.

In an (n+1)-th cycle, the third core 230 may disable an update function for the second register 262 to stop the synchronization of the first and registers 261 and 262, and may reflect the result of control operation A, which is performed by the first core 210, in the first register 261. That is, the third core 230 may disable the update function for the second register 262 to prevent data in the first register 261 from being stored in the second register 262 while data is being stored in the first register 261. Then, the third core 230 may update the first register 261 by storing the result of control operation A in the first register 261 and may activate the update function for the second register 262 so that the first and second registers 261 and 262 may be synchronized.

In an (n+2)-th cycle, the first and second registers 261 and 262 may be synchronized (i.e., data obtained from the first register 261 may be stored in the second register 262), and a switch control signal may be output to the charging system 100 based on the data stored in the second register 262. As the update function for the second register 262 is disabled and activated, all the data stored in the first register 261 may be stored in the second register 262 over a predetermined amount of time so that the first and second registers 261 and 262 may be synchronized.

If control operation A is prolonged and carried over to the (n+2)-th cycle, the result of part of control operation A performed in the (n+1)-th cycle may be stored first in the first register 261, and the result of part of control operation A performed in the (n+2)-th cycle may be additionally stored in the first register 261. For example, if control operation A is performed over two cycles, i.e., the (n+1)-th and (n+2)-th cycles, some of the result of control operation A may be stored in the first register 261 in the (n+1)-th cycle, and some of the result of control operation A performed in the first register 261 in the (n+2)-th cycle. Then, if the update function for the second register 262 is disabled during or after control operation A in the (n+2)-th cycle, some of data generated during the (n+2)-th cycle may not be stored in the second register 262. In this case, only some of data generated during control operation A may be stored in the second register 262, and some of the data generated during control operation A may be omitted without being reflected in the second register 262 in the process of synchronizing the first and second registers 261 and 262. Then, an inaccurate switch control signal may be output to the charging system 100, adversely affecting the operation of the charging system 100.

Figure 6:
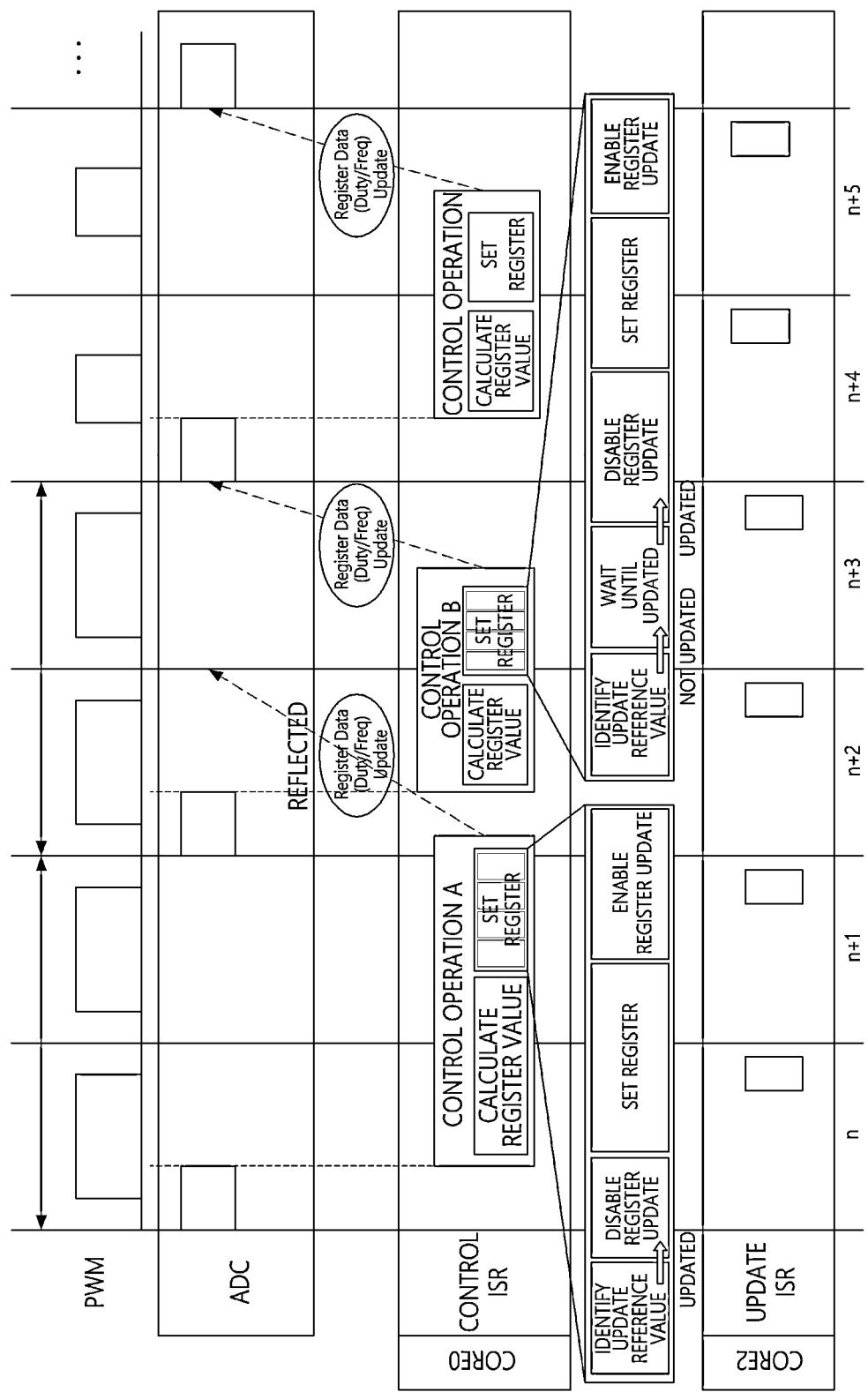
FIG. 6 illustrates cycles of a control operation in a case where a switch control signal is generated by a switch control method according to an embodiment of the present disclosure.
Figure 7:
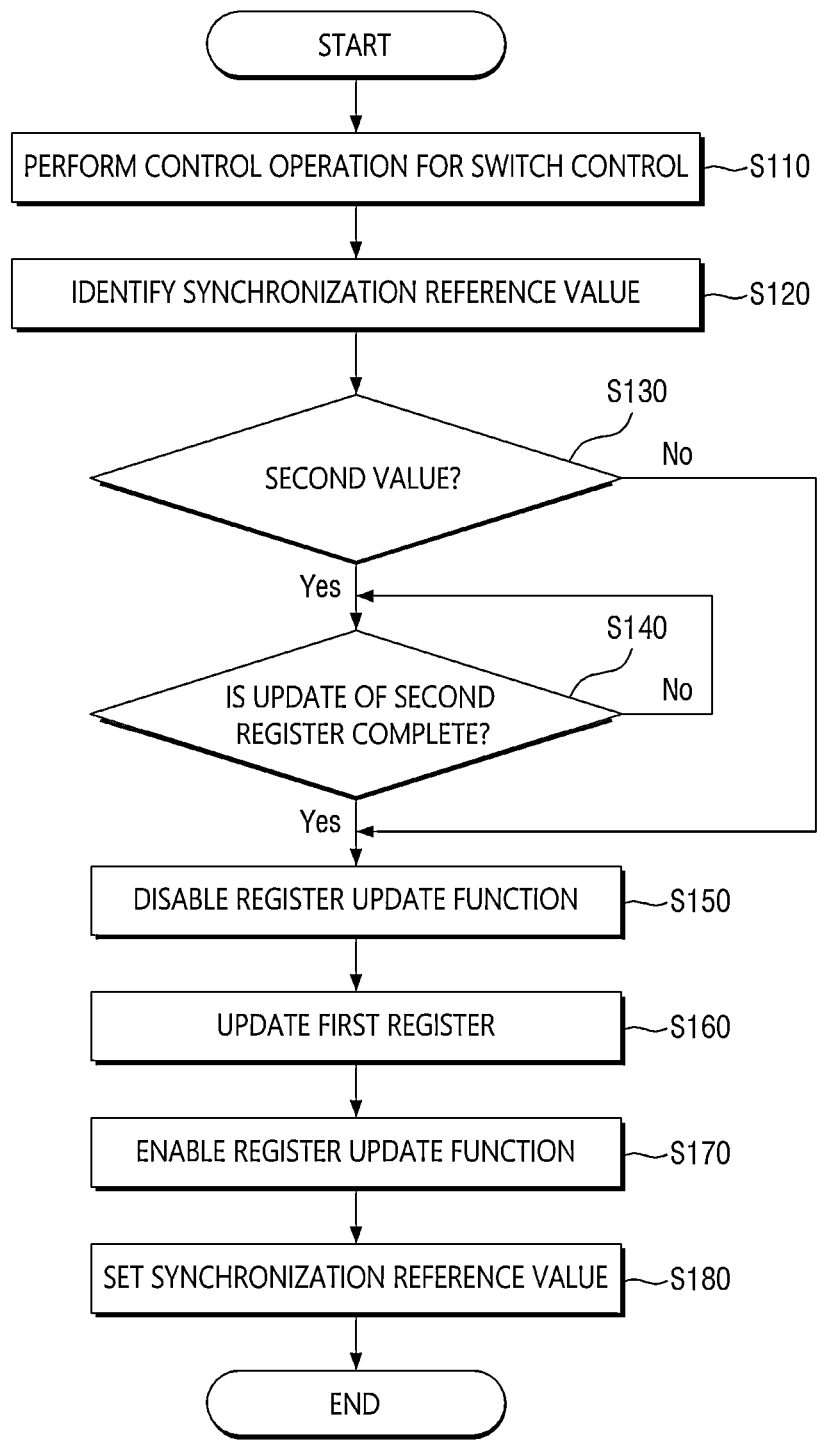
FIG. 7 is a flowchart illustrating how the control device can control switches of the charging system at high speed without the loss of data according to an embodiment of the present disclosure.

Referring to FIGS. 6 and 7, it is described how to control the switches of the charging system 100 without the loss of data.

FIG. 6 illustrates cycles of a control operation in a case where a switch control signal is generated by a switch control method according to an embodiment of the present disclosure.

Referring to FIG. 6, when the ADC 250 stops current or voltage sensing, the first core 210 may perform a control operation for switch control in an n-th cycle. The first core 210 may perform the control operation based on a sensing value from the ADC 250.

The third core 230 may generate update signals at intervals of a number of cycles and may count the number of update signals generated. The update signals are illustrated in FIG. 6 as being rectangles. The third core 230 may perform a routine of performing a register update when the result of the counting reaches a predetermined value or a multiple of the predetermined value. Referring to FIG. 6, the first and third cores 210 and 230 may perform a control operation based on an ISR and reflect the result of the control operation.

In an (n+1)-th cycle, the third core 230 may identify a synchronization reference value, which is stored in advance, before storing the result of control operation A in the first register 261 and may determine whether the synchronization reference value is set to a first value or a second value. The synchronization reference value is a type of flag. The first value may be a value indicating that a switch control signal based on control data (i.e., the result of control operation A) from the n-th cycle, the preceding cycle to the (n+1)-th cycle, is being output, and the second value may be a value indicating that the switch control signal based on the control data from the n-th cycle is not being output. The first and second values may be values that the synchronization reference value may be set to and may be frequency or duty values. The first and second values may be stored in a predetermined storage means or in one of the first, second, third, and fourth registers 261, 262, 263, and 264.

If the synchronization reference value is identified in the (n+1)-th cycle as being set to the first value, the third core 230 may determine that the first and second registers 261 and 262 are in proper synchronization with each other, and that the switch control signal based on the control data from the n-th cycle is being output. It may then perform a routine for storing other data in the first register 261. Specifically, the third core 230 may disable the update function for the second register 262 to stop the synchronization of the first and second registers 261 and 262, and may reflect the result of control operation A performed by the first core 210 in the first register 261. The third core 230 may determine whether to set the synchronization reference value to the first or second value and may set the synchronization reference value accordingly. The third core 230 may compare data of the first register 261 and data of the second register 262 and may set the synchronization reference value to the second value if the data of the first register 261 and the data of the second register 262 do not coincide with each other.

In an (n+2)-th cycle, the first and second registers 261 and 262 are synchronized (i.e., data obtained from the first register 261 is stored in the second register 262), and a switch control signal is output to the charging system 100 based on the data stored in the second register 262.

FIG. 6 illustrates a case where the synchronization reference value is set to the second value in an (n+3)-th cycle. Referring to FIG. 6, if the synchronization reference value is set to the second value in the (n+3)-th cycle, the third core 230 may determine that the first and second registers 261 and 262 have not been properly synchronized in the (n+2)-th cycle, which is previous to the (n+3)-th cycle, and may maintain a standby state until the first and second registers 261 and 262 are properly synchronized. That is, if the synchronization reference value is identified in the (n+3)-th cycle as being set to the second value, the third core 230 may determine that only some of control data generated in accordance with control operation A is stored in the first register 261, and not in the second register 262, and may maintain the standby state.

If the synchronization of data between the first and second registers 261 and 262 is complete, the third core 230 may disable the update function for the second register 262 so that the synchronization of the first and second registers 261 and 262 for control operation A may be stopped, and may store data corresponding to the result of control operation performed by the first core 210 in the first register 261. The third core 230 may determine whether to set the synchronization reference value to the first or second value and may set the synchronization reference value accordingly. Specifically, the third core 230 may compare the data of the first register 261 and the data of the second register 262. Then, if the data of the first register 261 and the data of the second register 262 do not coincide with each other, the third core 230 may set the synchronization reference value to the second value. On the contrary, if the data of the first register 261 and the data of the second register 262 coincide with each other, the third core 230 may set the synchronization reference value to the first value.

FIG. 7 is a flowchart illustrating how the control device 200 can control the switches of the charging system 100 at high speed without the loss of data.

Specifically, FIG. 7 illustrates how to generate a switch control signal via the first and third cores 210 and 230.

Referring to FIG. 7, when the ADC 250 stops voltage or current sensing, the first core 210 may generate second control data (S110) by performing a control operation for switch control in a second cycle. The second control data may be generated based on the voltage or current sensed by the ADC 250.

Thereafter, the third core 230, which is classified into the same group as the first core 210, may identify the synchronization reference value (S120) to determine whether a first control signal based on a first control data generated in a first cycle previous to the second cycle is being output to the charging system 100.

Thereafter, the third core 230 may determine whether the synchronization reference value is set to the second value. If the synchronization reference value is set to the second value, the third core 230 may determine in S130 that the first control signal is not being output to the charging system 100. Then, the third core 230 may defer storing the second control data in the first register 262 and may stand by until the first control signal is output to the charging system 100.

Thereafter, the third core 230 may monitor whether the synchronization of the first and second registers 261 and 262 is complete (S140). Then, when all the data of the first register 261 is stored in the second register 262, the third core 230 may disable the update function for the second register 262 (S150) so that the synchronization of the first and second registers 261 and 262 may be stopped.

Thereafter, the third core 230 may update the first register 261 (S160) by storing the second control data, which is the result of the control operation performed by the first core 210, in the first register 261. Then, the third core 230 may activate the update function for the second register 262 (S170). Once the update function for the second register 262 is activated, the updated first register 261 may be synchronized with the second register 262 in a subsequent cycle, i.e., in a third cycle.

Following, the third core 230 may determine whether to set the synchronization reference value to the first or second value (S180) and may set the synchronization reference value accordingly (S180). Specifically, after activating the update function for the second register 262, the third core 230 may monitor whether the data stored in the first register 261 and the data stored in the second register 262 coincide with each other and may set the synchronization reference value to the first or second value based on the result of the monitoring.

FIG. 7 shows exemplary steps of generating control data and setting the synchronization reference value, and the control device 200 may perform the steps illustrated in FIG. 7 repeatedly.

According to the embodiment of FIG. 7, the data of the first register 261 and the data of the second register 262 can be synchronized without the loss of data. Also, as switch control data can be generated at high speed, the entire charging system 100 can be miniaturized, and as a result, the manufacturing cost of the charging system 100 can be reduced.

FIG. 8 is a table showing the time taken by each core to perform a control operation in a case where the switch control method according to an embodiment of the present disclosure is applied. Referring to FIG. 8, "PFC" refers to the power factor correction converter 110, "DCDC" refers to the high-voltage DC-to-DC converter 120, and "LDC" refers to the low-voltage DC-to-DC converter 130.

Referring to FIG. 8, a control operation for switch control may be performed at intervals of two cycles. The power factor correction converter 110, the high-voltage DC-to-DC converter 120, and the low-voltage DC-to-DC converter 130 may be controlled digitally.

Embodiments of the present disclosure have been described above with reference to FIGS. 1 through 8, but it should be noted that the effects of the present disclosure are not limited to those described above, and other effects of the present disclosure should be apparent from the following description.

The technical features of the present disclosure described so far may be embodied as computer readable codes on a computer readable medium. The computer readable medium may be, for example, a removable recording medium (CD, DVD, Blu-ray disc, USB storage device, removable hard disk) or a fixed recording medium (ROM, RAM, computer equipped hard disk). The computer program recorded on the computer readable medium may be transmitted to other computing device via a network such as internet and installed in the other computing device, thereby being used in the other computing device.

Although operations are shown in a specific order in the drawings, it should not be understood that desired results can be obtained when the operations must be performed in the specific order or sequential order or when all of the operations must be performed. In certain situations, multitasking and parallel processing may be advantageous. According to the above-described embodiments, it should not be understood that the separation of various configurations is necessarily required, and it should be understood that the described program components and systems may generally be integrated together into a single software product or be packaged into multiple software products.

In concluding the detailed description, those having ordinary skill in the art should appreciate that many variations and modifications can be made to the embodiments without substantially departing from the principles of the present disclosure. Therefore, the disclosed embodiments of the present disclosure are used in a generic and descriptive sense only and not for purposes of limitation.

What is claimed is:

1. A switch control method for a control device controlling switches included in a charging system, the switch control method comprising:
generating second control data, which is for controlling the switches, in a second cycle;
determining whether a first control signal based on first control data, which has been generated in a first cycle, is being output to the charging system; and
in response to determining that the first control signal is being output to the charging system, storing the second control data in a first register.

2. The switch control method of claim 1, wherein the first cycle is a cycle previous to the second cycle.

3. The switch control method of claim 1, wherein:
determining whether the first control signal is being output to the charging system, comprises determining that the first control signal is being output to the charging system when the first control data is stored in a second register,
the second register obtains the first control data from the first register and stores the obtained first control data therein in the first cycle or in a cycle previous to the first cycle, and
the first control signal is output based on the first control data stored in the second register.

4. The switch control method of claim 1, wherein
determining whether the first control signal is being output to the charging system comprises: identifying a synchronization reference value and determining that the first control signal is being output to the charging system when the synchronization reference value is set to a first value, and
wherein the first value is a value indicating that the first control signal is being output to the charging system.

5. The switch control method of claim 1, further comprising, after the storing the second control data in the first register:
setting the synchronization reference value to a first value or a second value,
wherein the first value indicates that a second control signal based on the second control data is being output to the charging system, and
wherein the second value indicates that the second control signal is not being output to the charging system.

6. The switch control method of claim 5, wherein storing the second control data in the first register comprises: inactivating an update function for the second register, storing the second control data in the first register, and storing the second control data stored in the first register in the second register by activating the update function for the second register.

7. The switch control method of claim 6, wherein setting the synchronization reference value to the first or second value comprises: setting the synchronization reference value to the first or second value based on whether data stored in the first register coincides with data stored in the second register.

8. The switch control method of claim 1, further comprising:
deferring storing of the second control data in the first register until the first control signal is output when it is determined that the first control signal is not being output to the charging system.

9. The switch control method of claim 1, wherein:
generating the second control data in the second cycle is performed by a first core included in a processor, and
storing the second control data in the first register is performed by a second core included in the processor.

10. The switch control method of claim 1, wherein the first control signal is a pulse width modulation (PWM)-based signal.

11. The switch control method of claim 1, wherein the first control signal is a signal for controlling at least one of switches included in a power factor correction converter, switches included in a high-voltage direct current-to-direct current (DC-to-DC) converter, or switches included in a low-voltage DC-to-DC converter.

12. A switch control apparatus comprising:
a first register;
a second register configured to store first control data generated in a first cycle;
a first core configured to generate second control data, which is used for controlling switches included in a charging system, in a second cycle; and
a second core configured to store the second control data in the first register when it is determined that a first control signal based on the first control data is being output to the charging system.

13. The switch control apparatus of claim 12, wherein the first cycle is a cycle previous to the second cycle.

14. The switch control apparatus of claim 12, wherein the first control signal is a signal for controlling at least one of switches included in a power factor correction converter, switches included in a high-voltage direct current-to-direct current (DC-to-DC) converter, or switches included in a low-voltage DC-to-DC converter.

15. The switch control apparatus of claim 12, further comprising:
an analog-to-digital converter (ADC) configured to sense a current or a voltage generated in the charging system and convert the sensed current or voltage into digital data,
wherein the first core is configured to generate second control data, which is used for controlling the switches, in the second cycle when a sensing operation performed by the ADC is stopped.

16. The switch control apparatus of claim 12, wherein the second register is configured to store pulse width modulation (PWM) duty data or frequency data.

17. The switch control apparatus of claim 12, wherein the second register is configured to obtain data stored in the first register and store the obtained data therein upon the arrival of a predetermined cycle.

18. The switch control apparatus of claim 12, wherein the second core is configured to determine that the first control signal is being output to the charging system when the synchronization reference value is set to a first value, and configured to determine that the first control signal is not being output to the charging system when the synchronization reference value is set to a second value.

19. The switch control apparatus of claim 12, wherein after storing the second control data in the first register, the second core is configured to set the synchronization reference value to a first value when a second control signal based on the second control data is being output to the charging system, and configured to set the synchronization reference value to a second value when the second control signal is not being output to the charging system.

20. The switch control apparatus of claim 19, wherein after storing the second control data in the first register, the second core is configured to set the synchronization reference value to the first or second value based on whether data stored in the first register coincides with data stored in the second register.

* * * * *